United States Patent
Lin et al.

(10) Patent No.: US 6,177,310 B1
(45) Date of Patent: Jan. 23, 2001

(54) METHOD FOR FORMING CAPACITOR OF MEMORY CELL

(75) Inventors: Kuen-Yow Lin, Chia-I; Horng-Nan Chern, Chia-Li Chen, both of (TW)

(73) Assignee: United Microelectronics Corp., Hsin-Chu (TW)

(*) Notice: Under 35 U.S.C. 154(b), the term of this patent shall be extended for 0 days.

(21) Appl. No.: 09/472,132

(22) Filed: Dec. 23, 1999

(51) Int. Cl.$^7$ .................................................. H01L 21/8242
(52) U.S. Cl. ............................................ 438/255; 438/398
(58) Field of Search ............................. 438/238–241, 438/253–256, 381, 396–399

(56) References Cited

U.S. PATENT DOCUMENTS

| | | | |
|---|---|---|---|
| 5,989,952 | * 11/1999 | Jen et al. | 438/253 |
| 6,080,619 | * 6/2000 | Chien et al. | 438/253 |

* cited by examiner

Primary Examiner—Jey Tsai

(57) ABSTRACT

A method for forming a capacitor of memory cell is disclosed. The method includes, firstly, there is a semiconductor substrate that owns a first dielectric layer formed thereon. The first dielectric layer has a contact opening filled with doped polysilicon to form a stud. Then, a second dielectric layer is formed on the first dielectric layer and the surface of the stud. A silicon oxynitride (SiON) layer can be formed on the second dielectric layer. A photoresist layer is formed on the silicon oxynitride layer. Portions of the silicon oxynitride layer and the second dielectric layer are etched. Blanket and conformably forming an amorphous silicon layer is carried out. A third dielectric layer is formed on the amorphous silicon layer. The third dielectric layer and a portion of the amorphous silicon layer atop of the silicon oxynitride layer are all etched back. The silicon oxynitride layer is used as an anti-etching layer. The amorphous silicon layer will be treated to form a hemispherical-grained (HSG) layer on the surface of the amorphous silicon layer. The silicon oxynitride layer is removed. Dipping the surface of the second dielectric layer is achieved to comprehensively clean the surface thereof, thereby preventing unwanted connection of the hemispherical-grained layer on the capacitor with the hemispherical-grained layer out of the capacitor.

16 Claims, 4 Drawing Sheets

METHOD FOR FORMING CAPACITOR OF MEMORY CELL

BACKGROUND OF THE INVENTION

1. Field of the Invention

The present invention relates to the formation of capacitor of memory cell, and more particularly for using silicon oxide on a silicon substrate layer of silicon wafer for semiconductor device.

2. Description of the Prior Art

Currently, one of the main art for improving DRAM performance could be hemi-spherical grain (HSG) process. In fact, recently Hemi-Spherical Grain (HSG) process is gradually applied to the production technology of High-Density DRAM in practical. Furthermore, HSG process ideally will increase the surface area of silicon layer in order to expand the capacity of DRAM, this issue was presented by some of previous laboratory experience already.

Basically HSG process is firstly to be deposited an alpha-type silicon thin film on the substrate of silicon wafer inside a PCVD furnace at 1 torr and 510° C. to 550° C. Consequentially alpha-Silicon film surface is cleaned using SC-1 wet cleaning and then the native oxide layer is removed by HF dipping. Afterward HSG will grew up in furnace chamber. Firstly, the chamber is pre-heat before loading the wafer into furnace chamber. When wafer is irradiated about 60 seconds, then conducting gas into the chamber. At this step, temperature is arrived about 200° C. to 300° C., then the gas is ceased after about 60 seconds. Thirdly temperature is held at 600° C. The whole treatment time is about 300 seconds at least. The pressure is about $10^{-5}$ torr when conducting the gas. Also, when the gas is not conducted into the chamber, the pressure will be about $10^{-8}$ torrs, also the gas fluid is about 10 sccms.

However, unfortunately hemispherical grain (HSG) process is still not totally desirable because there still is a short road problem, such as FIG. 1. From FIG. 1, it is apparently found that HSG in Portion 1 and HSG in portion 2 are too close so that it will cause bridging problem. On the other hand, it is still necessary to be refined again. According to this consideration, this present invention now submits a brand new preferred method for forming HSG in DRAM structure.

Generally, demand for high-density dynamic random access memory (DRAM) has rapidly increased due to widespread use of electronic equipment. In particular, the increasing popularity of some electronic equipment such as, for example, many kinds of computers are gradually increasing the demand for the large or very large semiconductor memories in this modern century and next coming twenty-one century. Therefore, the advanced manufacture technology for improvement fabrication of DRAM should be urgently need than before.

SUMMARY OF THE INVENTION

In accordance with the present invention, a method is provided for forming a capacitor that substantially existing on the substrate for silicon wafer of semiconductor.

First of all, there is a semiconductor substrate that owns a first dielectric layer formed thereon. The first dielectric layer has a contact opening filled with doped polysilicon to form a stud. Then, a second dielectric layer is formed on the first dielectric layer and the surface of the stud. A silicon oxynitride (SiON) layer can be formed on the second dielectric layer. A photoresist layer is formed on the silicon oxynitride layer to define an area for the capacitor by a ring pattern located over the stud. Portions of the silicon oxynitride layer and the second dielectric layer are etched using the ring pattern of the photoresist layer as an etch mask. Blanket and conformably forming an amorphous silicon layer is carried out on the surface of the silicon oxynitride layer, the first dielectric layer, and the stud, and on the sidewall of the capacitor. A third dielectric layer is formed on the amorphous silicon layer. The third dielectric layer and a portion of the amorphous silicon layer atop of the silicon oxynitride layer are all etched back until the silicon oxynitride layer is exposed. The silicon oxynitride layer is used as an anti-etching layer, therefore the capacitor comprised of the amorphous silicon layer is formed and located within the cylinder. The amorphous silicon layer will be treated to form a hemispherical-grained (HSG) layer on the surface of the amorphous silicon layer. The silicon oxynitride layer is removed, thereby resulting in the capacitor with the hemispherical-grained layer covering only the internal surface of the capacitor while leaving the external surface of the pillar uncovered by the hemispherical-grained layer. Dipping the surface of the second dielectric layer is achieved to comprehensively clean the surface thereof, thereby preventing unwanted connection of the hemispherical-grained layer on the capacitor with the hemispherical-grained layer out of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to semiconductor device, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

Therefore, the method for forming a capacitor of memory cell will be provided, so that the spirit of the proposed invention can be explained and understood by the following embodiments with corresponding figures.

Figure 1:
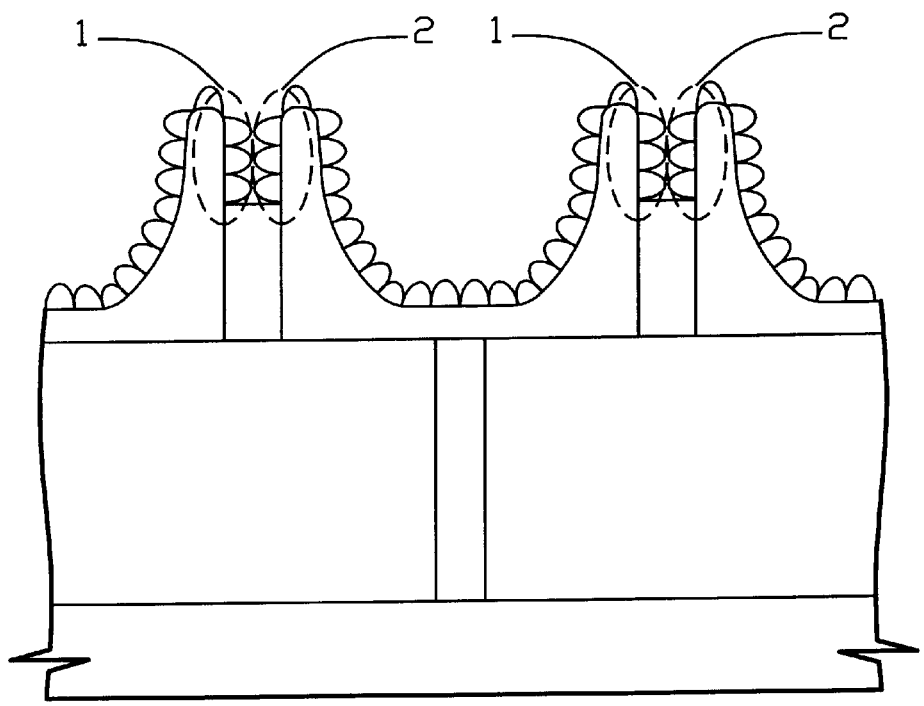
FIG. 1 shows the hemi-spherical grain (HSG) structure according to the conventional method.
Figure 2A:
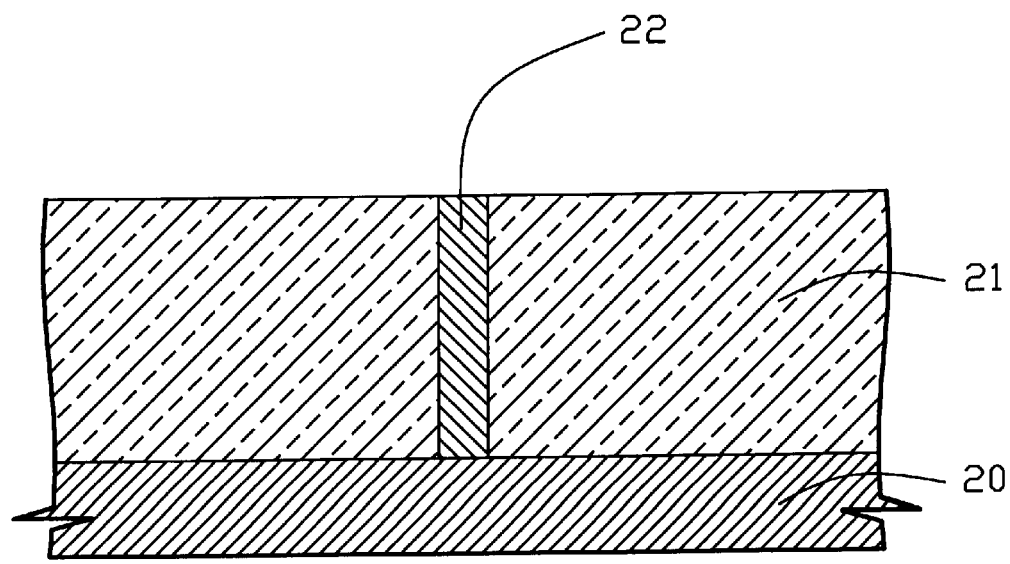
FIG. 2A to 2G shows that the whole process according to the present invention.

In the preferred embodiment according to the present invention, first of all, there is semiconductor substrate 20 that owns first dielectric layer 21 formed thereon indicated as FIG. 2A. First dielectric layer 21 has a contact opening filled with doped polysilicon to form stud 22. Also, the material for this first dielectric layer is a kind of silicon dioxide.

Figure 2B:
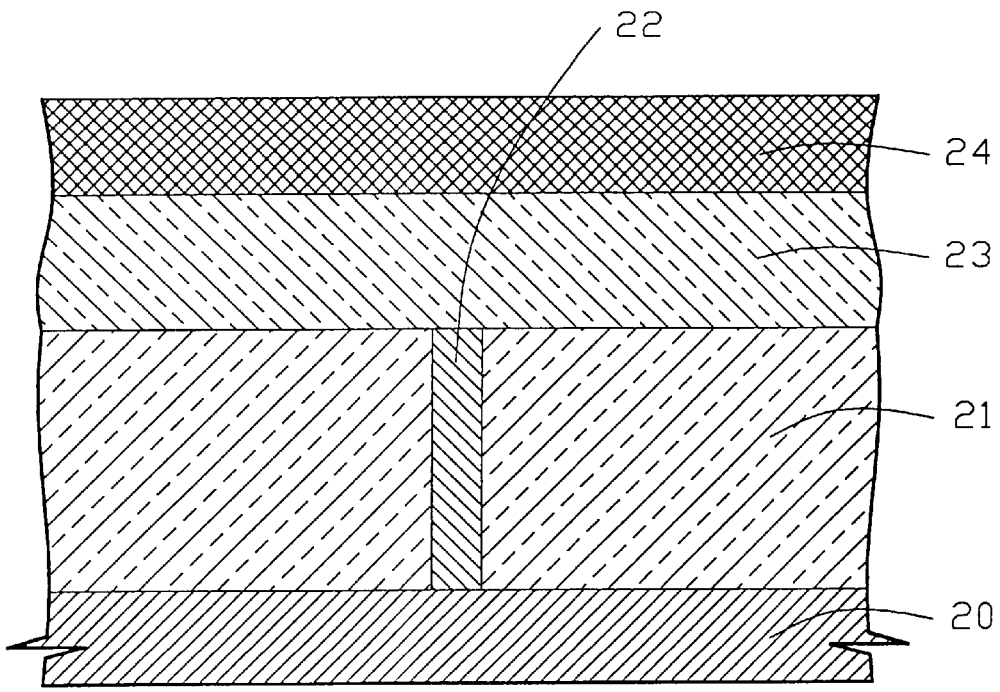

Then, as shown in FIG. 2B, second dielectric layer 23 is formed on first dielectric layer 21 and the surface of stud 22. The material for this second dielectric layer is a kind of silicon dioxide. Silicon oxynitride (SiON) layer 24 can be formed on second dielectric layer 23.

Figure 2C:
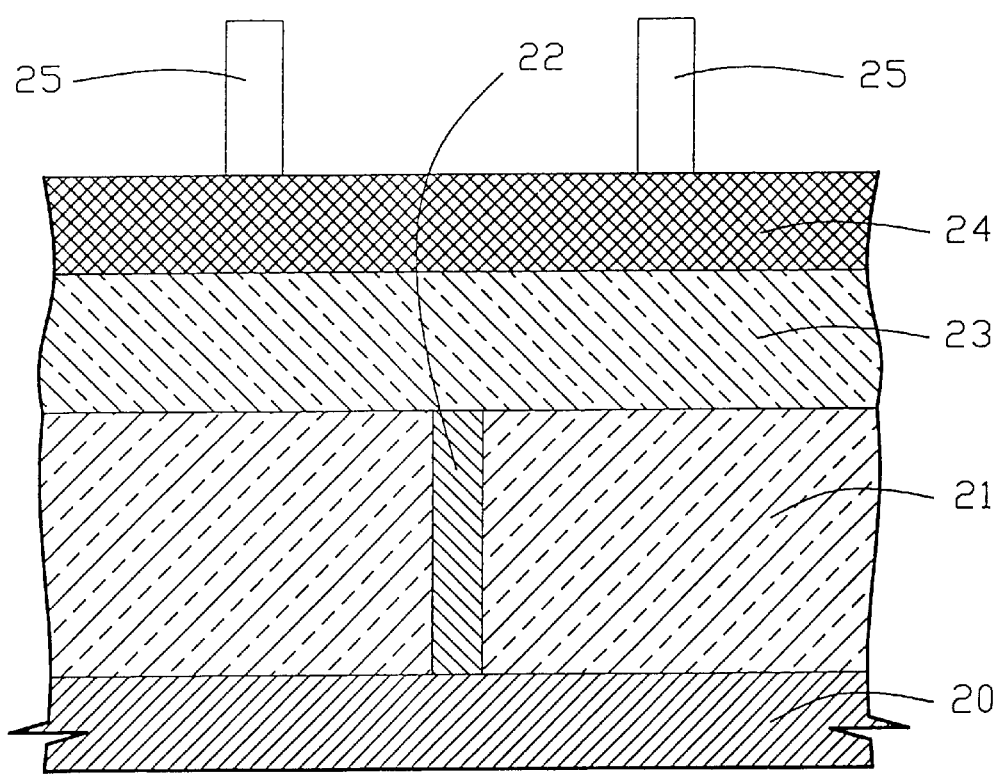

As FIG. 2C, photoresist layer 25 is formed on silicon oxynitride layer 24 to define an area for the capacitor by a ring pattern located over stud 22.

Figure 2D:
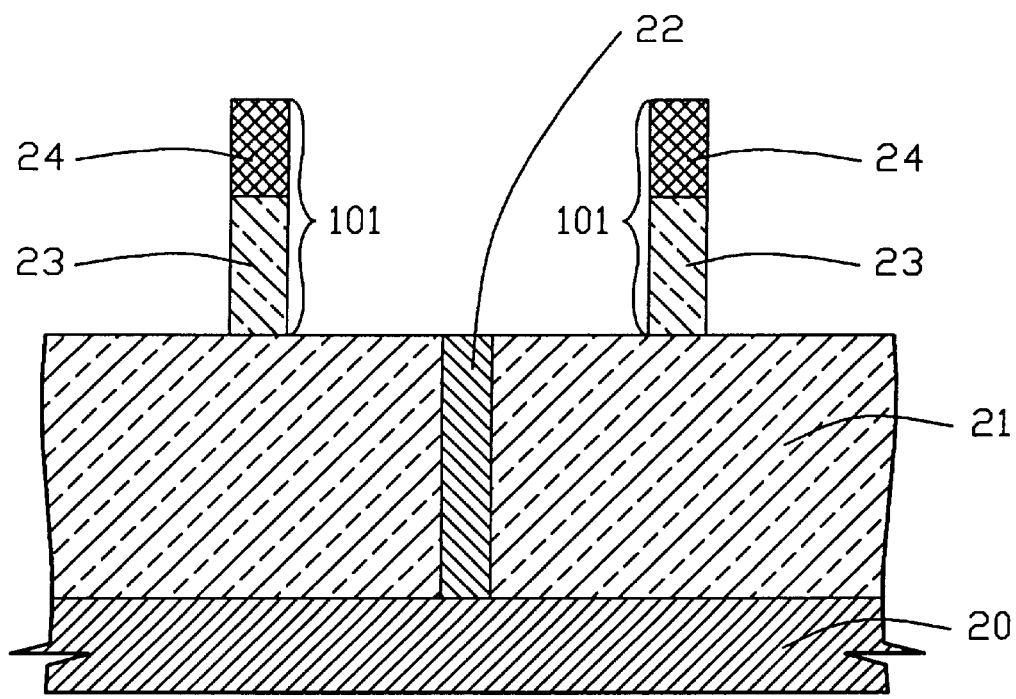

FIG. 2D shows that portions of silicon oxynitride layer 24 and second dielectric layer 23 are etched using the ring pattern of photoresist layer 25 as an etch mask, thereby resulting in a pillar comprised of second dielectric layer 23 and silicon oxynitride layer 24.

Figure 2E:
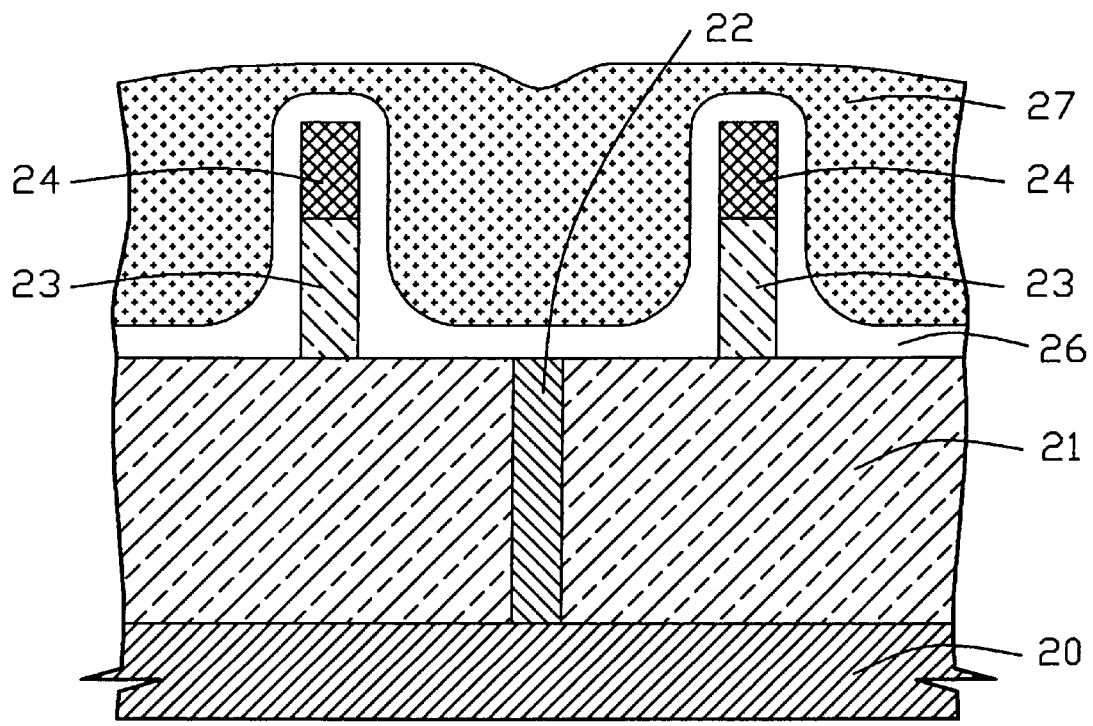

It is shown as FIG. 2E, blanket and conformably forming amorphous silicon layer 26 is carried out on the surface of silicon oxynitride layer 24, first dielectric layer 21, and stud 22, and on the sidewall of the pillar. Third dielectric layer 27 is formed on amorphous silicon layer 26.

Figure 2F:
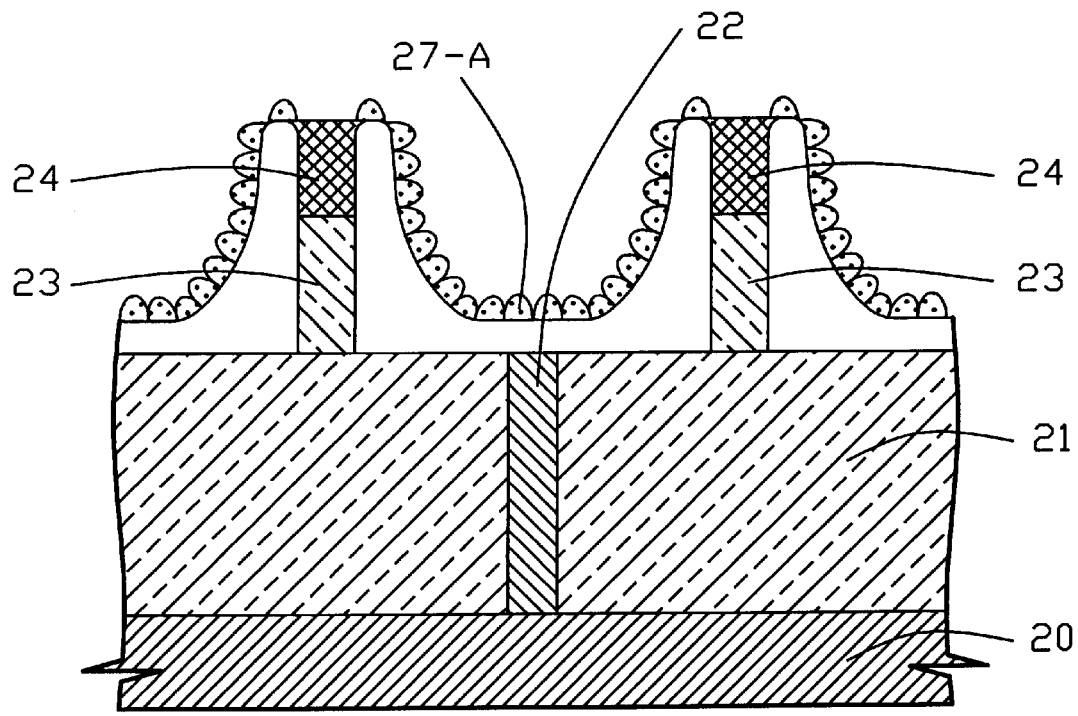

With referring to FIG. 2F, third dielectric layer 27 and a portion of amorphous silicon layer 26 atop of silicon oxynitride layer 24 are all etched back until silicon oxynitride layer 24 is exposed. Here, the material for this third dielectric layer is a kind of silicon dioxide. Etching back the above third dielectric layer is carried out using buffered oxide etch (BOE). Silicon oxynitride layer 24 is used as an anti-etching layer. Amorphous silicon layer 26 will be treated to form a hemispherical-grained (HSG) layer on the surface of amorphous silicon layer 27, such as hemispherical-grained layer 27-A.

Figure 2G:
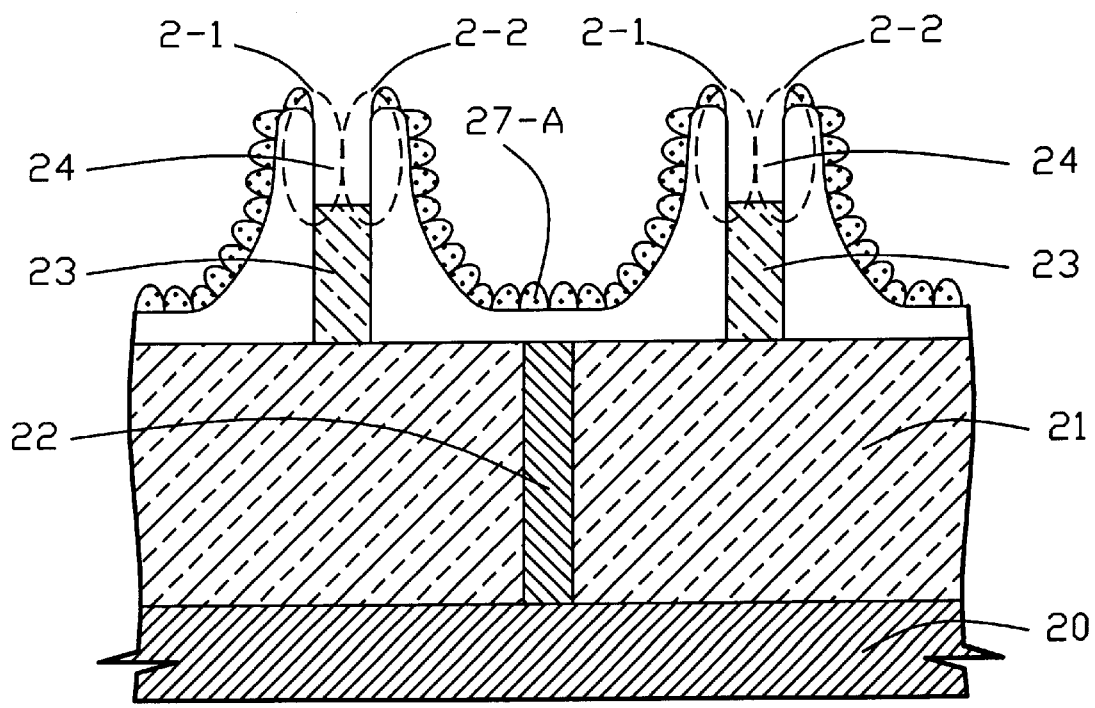

Sequentially, as FIG. 2G, finally silicon oxynitride layer 24 is removed using HF etchant solution, thereby resulting in the capacitor with hemispherical-grained layer 27-A covering only the internal surface of the pillar while leaving the external surface of the capacitor uncovered by hemispherical-grained layer 27-A. Dipping the surface of second dielectric layer 23 is achieved to comprehensively clean the surface thereof, thereby preventing unwanted connection of hemispherical-grained layer 27-A, such as legend 2-1 and legend 2-2 on the capacitor with the hemispherical-grained layer 27-A out of the capacitor.

Therefore, according to the above processing, the main formation mechanism of the hemi-spherical grain (HSG) could be described as the following statement. Firstly at the temperature of crystallization, the mobility of surface atoms enables them to nucleate at the amorphous Silicon surface. Then the nucleation rate at the surface may be higher than at the amorphous $Si/SiO_2$ interface, at least near 600° C. The grain growth can proceed in three ways:

1. conventional solid phase growth from the nucleus downward into the amorphous silicon,
2. a novel mode in which atoms with high mobility climb up the nucleus surface, and
3. the nucleus virtually acts as a sink for such surface migrating atoms and grows into the silicon grain.

Thus, the main purpose of annealing is as a method for energy release involving. Generally, there are three stages for annealing process, which concludes recovery, recrystallization and grain growth.

When a material is plastically deformed at temperature that is low relative to its melting point, it is cold worked. Most of the energy expended in cold work appears in the form of heat, but a finite fraction is stored in the material as strain energy associated with various lattice defects created by the deformation. Cold working is known to increase greatly the number of dislocation in a material. In the first, the annealing method, the cold-worked material is heated continuously from a lower to a higher temperature and the energy release is determined as a function of temperature. The main purpose of energy release involves annealing. Energy is released before recrystallization; the part of the annealing cycle that occurs before recrystallization is called recovery. Normally reactions occur during the recovery stages are able to continue during the progress of recrystallization. The third stage of annealing is grain growth occurs when annealing is continued after recrystallization has been completed. In grain growth, certain of the crystallization grains continue to grow in size.

Therefore, the preferred embodiment for forming a capacitor can be briefly described as the following. Firstly, there is a semiconductor substrate that owns a first dielectric layer formed thereon. The first dielectric layer has a contact opening filled with doped polysilicon to form a stud. Then, a second dielectric layer is formed on the first dielectric layer and the surface of the stud. A silicon oxynitride (SiON) layer can be formed on the second dielectric layer. A photoresist layer is formed on the silicon oxynitride layer to define an area for the capacitor by a ring pattern located over the stud. Portions of the silicon oxynitride layer and the second dielectric layer are etched using the ring pattern of the photoresist layer as an etch mask. Blanket and conformably forming an amorphous silicon layer is carried out on the surface of the silicon oxynitride layer, the first dielectric layer, and the stud, and on the sidewall of the pillar. A third dielectric layer is formed on the amorphous silicon layer. The third dielectric layer and a portion of the amorphous silicon layer atop of the silicon oxynitride layer are all etched back until the silicon oxynitride layer is exposed. The silicon oxynitride layer is used as an anti-etching layer. The amorphous silicon layer will be treated to form a hemispherical-grained (HSG) layer on the surface of the amorphous silicon layer. The silicon oxynitride layer is removed, thereby resulting in the capacitor with the hemispherical-grained layer covering only the internal surface of the capacitor while leaving the external surface of the pillar uncovered by the hemispherical-grained layer. Dipping the surface of the second dielectric layer is achieved to comprehensively clean the surface thereof, thereby preventing unwanted connection of the hemispherical-grained layer on the capacitor with the hemispherical-grained layer out of the capacitor.

Although specific embodiments have been illustrated and described, it will be obvious to those skilled in the art that various modifications may be made without departing from what is intended to be limited solely by the appended claims.

What is claimed is:

1. A method for forming a capacitor, comprising:

providing a semiconductor substrate having a first dielectric layer formed thereon, wherein said first dielectric layer has a contact opening filled with conductive material to form a conductive stud;

forming a second dielectric layer on said first dielectric layer and the surface of the conductive stud;

forming a block layer on said second dielectric layer;

forming a photoresist layer on said block layer to define an area for the capacitor by a ring pattern located over the conductive stud;

etching portions of said block layer and said second dielectric layer using the ring pattern of the photoresist layer as an etch mask, thereby resulting in a pillar comprised of the second dielectric layer and the block layer;

blanket and conformably forming a silicon layer on the surface of said block layer, the first dielectric layer, and the conductive stud, and on the sidewall of said pillar;

forming a third dielectric layer on said silicon layer;

etching back said third dielectric layer and a portion of said silicon layer atop of said block layer until said block layer is exposed, wherein said block layer is used as an anti-etching layer;

treating said silicon layer to form a hemispherical-grained (HSG) layer on the surface of said silicon layer; and removing said block layer, thereby resulting in the capacitor with the hemispherical-grained layer covering only the internal surface of said capacitor while leaving the external surface of said pillar uncovered by the hemispherical-grained layer.

2. The method according to claim 1, wherein said conductive material of the conductive stud comprises doped polysilicon.

3. The method according to claim 1, wherein said first dielectric layer comprises silicon dioxide.

4. The method according to claim 1, wherein said second dielectric layer comprises silicon dioxide.

5. The method according to claim 4, wherein said block layer comprises silicon oxynitride (SiON).

6. The method according to claim 1, wherein said silicon layer comprises amorphous silicon.

7. The method according to claim 1, wherein said third dielectric layer comprises silicon dioxide.

8. The method according to claim 1, wherein said third dielectric layer is etched back by using buffered oxide etch (BOE).

9. The method according to claim 5, wherein said block layer is removed by HF etchant solution.

10. The method according to claim 9, further comprising dipping the surface of said second dielectric layer to comprehensively clean the surface thereof, thereby preventing unwanted connection of the hemispherical-grained layer on said capacitor with the hemispherical-grained layer out of said capacitor.

11. A method for forming a capacitor of memory cells, comprising:

providing a semiconductor substrate having a first dielectric layer formed thereon, wherein said first dielectric layer has a contact opening filled with doped polysilicon to form a stud;

forming a second dielectric layer on said first dielectric layer and the surface of the stud;

forming a silicon oxynitride (SiON) layer on said second dielectric layer;

forming a photoresist layer on said silicon oxynitride layer to define an area for the capacitor by a ring pattern located over the stud;

etching portions of said silicon oxynitride layer and said second dielectric layer using the ring pattern of the photoresist layer as an etch mask, thereby resulting in a pillar comprised of the second dielectric layer and the block layer;

blanket and conformably forming an amorphous silicon layer on the surface of said silicon oxynitride layer, the first dielectric layer, and the stud, and on the sidewall of said pillar;

forming a third dielectric layer on said amorphous silicon layer;

etching back said third dielectric layer and a portion of said amorphous silicon layer atop of said silicon oxynitride layer until said silicon oxynitride layer is exposed, wherein said silicon oxynitride layer is used as an anti-etching layer;

treating said amorphous silicon layer to form a hemispherical-grained (HSG) layer on the surface of said amorphous silicon layer;

removing said silicon oxynitride layer, thereby resulting in the capacitor with the hemispherical-grained layer covering only the internal surface of said capacitor while leaving the external surface of said capacitor uncovered by the hemispherical-grained layer; and dipping the surface of said second dielectric layer to comprehensively clean the surface thereof, thereby preventing unwanted connection of the hemispherical-grained layer on said capacitor with the hemispherical-grained layer out of said capacitor.

12. The method according to claim 11, wherein said first dielectric layer comprises silicon dioxide.

13. The method according to claim 11, wherein said second dielectric layer comprises silicon dioxide.

14. The method according to claim 11, wherein said third dielectric layer comprises silicon dioxide.

15. The method according to claim 11, wherein said third dielectric layer is etched back by using buffered oxide etch (BOE).

16. The method according to claim 11, wherein said silicon oxynitride layer is removed by HF etchant solution.

* * * * *